(12) United States Patent
Freeman et al.

(10) Patent No.: US 11,942,997 B2
(45) Date of Patent: Mar. 26, 2024

(54) FAST SCAN METHOD AND APPARATUS FOR BEACON AUTO-TUNE

(71) Applicant: Infinera Corporation, San Jose, CA (US)

(72) Inventors: Paul N. Freeman, Saratoga, CA (US); Paul Gavrilovic, Allen, TX (US); Steven Joseph Hand, Los Gatos, CA (US)

(73) Assignee: Infinera Corporation, San Jose, CA (US)

( * ) Notice: Subject to any disclaimer, the term of this patent is extended or adjusted under 35 U.S.C. 154(b) by 0 days.

(21) Appl. No.: 17/383,395

(22) Filed: Jul. 22, 2021

(65) Prior Publication Data

US 2022/0029709 A1   Jan. 27, 2022

Related U.S. Application Data

(60) Provisional application No. 63/055,314, filed on Jul. 22, 2020.

(51) Int. Cl.
| | |
|---|---|
| *H04B 10/00* | (2013.01) |
| *H01S 5/026* | (2006.01) |
| *H01S 5/06* | (2006.01) |
| *H01S 5/068* | (2006.01) |
| *H01S 5/12* | (2021.01) |
| *H04B 10/61* | (2013.01) |
| *H04J 14/00* | (2006.01) |

(52) U.S. Cl.
CPC ......... *H04B 10/6164* (2013.01); *H01S 5/026* (2013.01); *H01S 5/0612* (2013.01); *H01S 5/068* (2013.01); *H01S 5/1234* (2013.01)

(58) Field of Classification Search
CPC ...... H04B 10/60; H04B 10/61; H04B 10/615; H04B 10/6164; H04B 10/63; H04B 10/64
See application file for complete search history.

(56) References Cited

U.S. PATENT DOCUMENTS

2016/0191195 A1\* 6/2016 Magri .................... H04L 5/006
                                                            398/79
2019/0393964 A1\* 12/2019 Tehrani .............. H04B 10/6165

\* cited by examiner

*Primary Examiner* — Daniel G Dobson
(74) *Attorney, Agent, or Firm* — David L. Soltz

(57) ABSTRACT

Consistent with the present disclosure, a local oscillator is provided in a receiver. The local oscillator laser a first and second mirrors and phase section and heaters are provided adjacent each portion of the laser, such that the temperature and thus the frequency of light output from the local oscillator laser may be tuned. Applying electrical power, such as a current or voltage to the phase section may result in rapid frequency tuning of light output from the local oscillator laser but over a limited frequency range. Temperature changes to the mirror sections, however, may afford frequency tuning over a wider range, but frequency tuning the mirror sections requires more time than that required to tune the phase section. Consistent with the present disclosure, a tuning method and apparatus is provided that optimizes laser tuning by selectively tuning the phase and mirror sections.

28 Claims, 13 Drawing Sheets

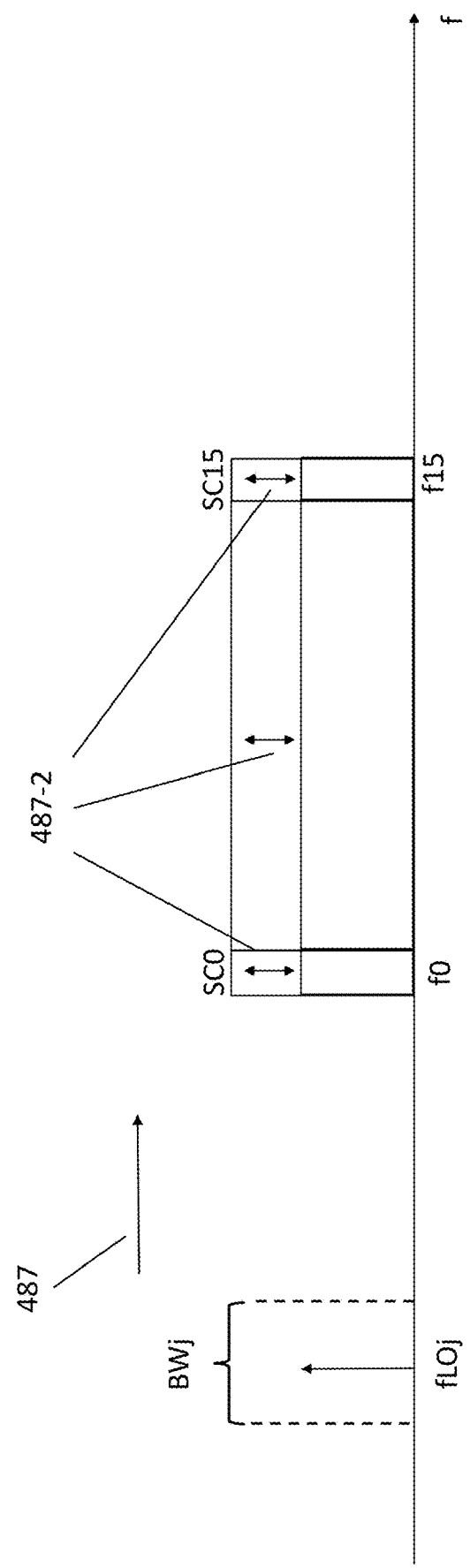

FAST SCAN METHOD AND APPARATUS FOR BEACON AUTO-TUNE

The present patent application hereby claims priority to the provisional patent application identified by U.S. Ser. No. 63/055,314 filed on Jul. 22, 202, the entire content of which is hereby incorporated by reference.

BACKGROUND

Optical networks are known whereby a primary or hub node transmits optical signals to a plurality of secondary or leaf nodes. In some implementations, each leaf node may include a coherent receiver that includes a local oscillator laser the provides local oscillator light. If the frequency of the local oscillator light is the same as or close to the frequency of an incoming optical signal from the hub node, the local oscillator light and the incoming optical signal will "beat" when mixed in an optical hybrid, so that data carried by the incoming optical signal can be detected by circuitry included in the receiver.

In such hub-leaf networks, nodes may be added or removed from the network. In the event a node is added to the network, the node should be able to communicate with other nodes as quickly as possible. For example, the newly added node, by communicating with other nodes, may be able to configure itself as either a hub or a leaf node, as required. Communication between the newly added node and other nodes in the network, however, typically requires that the local oscillator laser included in the coherent receiver of the newly added node should be at a frequency that permits the receiver to detect data carried by the incoming signal. Since the frequencies of optical signals transmitted by other nodes in the network may not be known in advance of adding the new node, the receiver of the newly added node should be tuned after insertion into the network to a frequency that facilitates detection of data carried by the incoming signal. Preferably, such tuning should be carried out relatively quickly so that a user can begin transmitting and receiving data from such the newly added node as soon as practicable.

The accompanying drawings, which are incorporated in and constitute a part of this specification, illustrate one (several) embodiment(s) and together with the description, serve to explain the principles of the invention.

BRIEF DESCRIPTION OF THE DRAWINGS

FIG. 4b illustrate local oscillator scanning or tuning consistent with the present disclosure;

DESCRIPTION OF THE EMBODIMENTS

Consistent with the present disclosure, a local oscillator is provided in a receiver. The local oscillator laser includes first and second mirrors and a phase section, and heaters are provided adjacent each portion of the laser, such that the temperature and thus the frequency of light output from the local oscillator laser may be tuned. Applying electrical power, such as a current or voltage to the phase section may result in rapid frequency tuning of light output from the local oscillator laser but over a limited frequency range. Temperature changes to the mirror sections, however, may afford frequency tuning over a wider range, but frequency tuning the mirror sections requires more time than that required to tune the phase section. Consistent with the present disclosure, a tuning method and apparatus is provided that optimizes laser tuning by selectively tuning the phase and mirror sections for rapid tuning across the C band (1530 nm-1565 nm), for example.

Reference will now be made in detail to the present embodiment(s) (exemplary embodiments) of the present disclosure, an example(s) of which is (are) illustrated in the accompanying drawings. Wherever possible, the same reference numbers will be used throughout the drawings to refer to the same or like parts.

Before describing frequency tuning consistent with the present disclosure, an example optical network and node structure in which such frequency tuning may be employed will next be described with reference to FIGS. 1-7.

Figure 1:
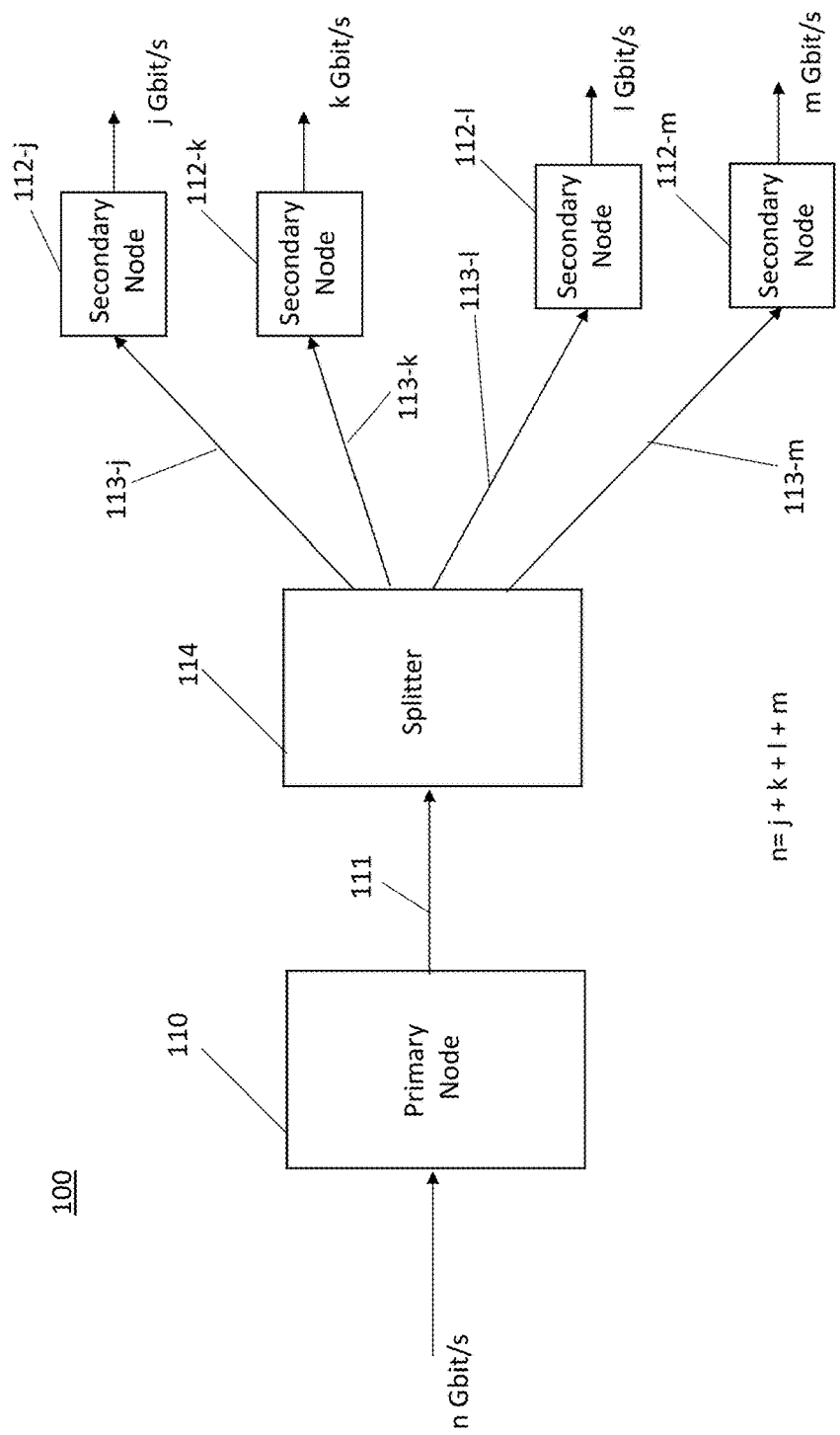
FIG. 1 illustrates an example of an optical network consistent with the present disclosure.

FIG. 1 illustrates an example of an aggregation network 100 consistent with the present disclosure in which primary node 110 may communicate with multiple secondary nodes 112-*j* to 112-*m*, which sometimes may be referred to individually or collectively as secondary node(s) 112. Secondary nodes 112, in one example, are remote from primary node 110. Primary node 110 may transmit optical subcarriers, described in greater detail below, in a downstream direction onto an optical communication path 111, which, like each of optical communication paths 113-*j* to 113-*m*, may include one or more segments of optical fiber, as well as one or more optical amplifiers, reconfigurable add-drop multiplexers (ROADMs) or other optical fiber communication equipment. Splitter 114 may be coupled to an end of optical communication path 111 to receive the optical subcarriers and provide a power split portion of each subcarrier to a corresponding one of secondary nodes 112-*j* to 112-*m* via a respective one of optical communication paths 113-*j* to 113-*m*.

As further shown in FIG. 1, primary node 110 has a data capacity to receive n Gbit/s of data (e.g., a data stream) for transmission to secondary node 112. Each secondary node 112 may receive and output to a user or customer a portion of the data input to primary node 110. In this example, secondary nodes 112-*j*, 112-*k*, 112-*l*, and 112-*m* output j Gbit/s, k Gbit/s, l Gbit/s, and m Gbit/s of data (data streams), respectively, whereby the sum of the j, k, l, and m may equal n (where j, k, l, m, and n are positive numbers).

Figure 2:
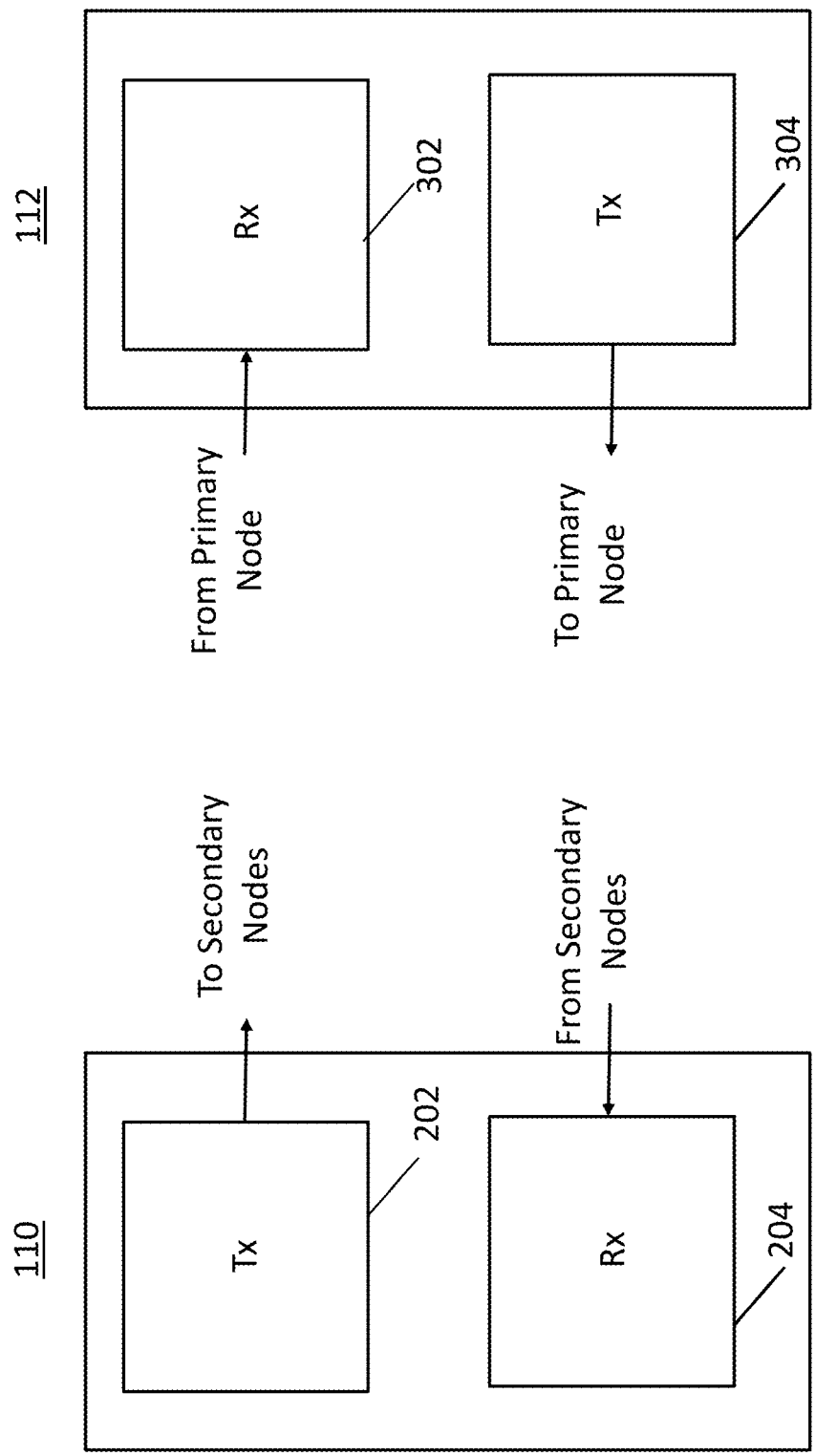
FIG. 2 illustrates block diagram of transceivers included in the hub and leaf nodes consistent with an aspect of the present disclosure.

FIG. 2 illustrates primary node 110 in greater detail. Primary node 110 may include a transmitter 202 that supplies a downstream modulated optical signal including subcarriers, and a receiver that 204 that may receive upstream subcarriers carrying data originating from the secondary nodes, such as nodes 112-*j* to 112-*m*.

FIG. 2 further shows a block diagram of one of secondary nodes 112, which may include a receiver circuit 302 that receives one or more downstream transmitted subcarriers, and a transmitter circuit 304 that transmits one or more subcarriers in the upstream direction. The receiver circuits 204 and 302 may include local oscillator lasers that may be tuned as described in greater detail below.

Figure 3:
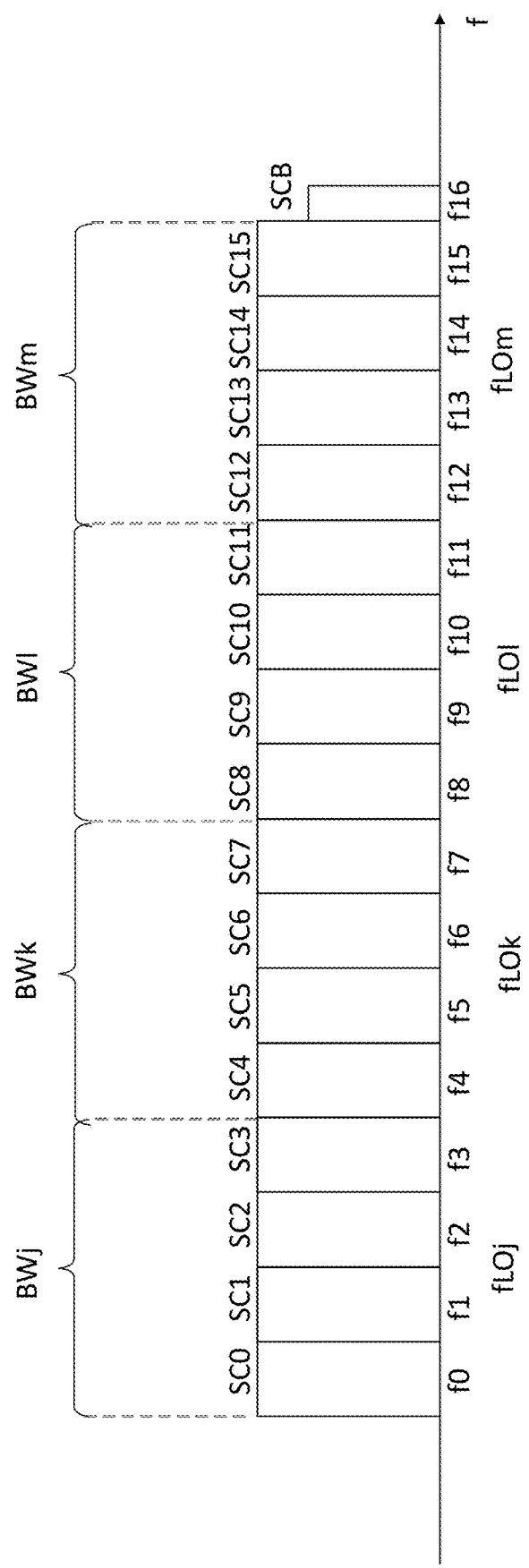
FIG. 3 illustrates an example of a power spectral density plot consistent with an aspect of the present disclosure.

FIG. 3 illustrates an example a power spectral density plot 300 consistent with an aspect of the present disclose. Power spectral density plot 300 shows, in this example, 16 optical subcarriers (SC0-SC15), which may be included in a modulated optical signal output from primary node 110. Each of subcarriers SC0 to SC15 has a corresponding one of frequencies f0 to f15. Subcarriers SC0 to SC15, in one example, are Nyquist subcarriers, which are a group of optical signals, each carrying data, wherein (i) the spectrum of each such optical signal within the group is sufficiently non-overlapping such that the optical signals remain distinguishable from each other in the frequency domain, and (ii) such group of optical signals is generated by modulation of light from a single laser. In general, each subcarrier may have an optical spectral bandwidth that is at least equal to the Nyquist frequency, as determined by the baud rate of such subcarrier. In another example, an individual subcarrier may be generated by modulating an optical signal supplied from a laser, and multiple subcarriers generated in this manner, in a respective leaf node, for example, may be combined and provided to a hub or primary node.

In one example, the bandwidth is a range of frequencies for which data carried by optical signals having frequencies within such range may be detected by the secondary nodes 112. As further shown in FIG. 3, each of secondary nodes 112-*j* to 112-*m* may have a respective one of bandwidths BWj to BWm, such that each secondary node has a data processing capacity or is capable of processing and outputting data carried by up to four subcarriers, in this example. Namely, in the example shown in FIG. 3, bandwidth BWj associated with secondary node 112-*j* extends over or encompasses a range including frequencies f0 to f3 of subcarriers SC0 to SC3, respectively; bandwidth BWk associated with secondary node 112-*k* extends over or encompasses a range including frequencies f4 to f7 of subcarriers SC4 to SC7, respectively; bandwidth BWl associated with secondary node 112-*l* extends over or encompasses a range including frequencies f8 to f11 of subcarriers SC8 to SC11, respectively; and bandwidth BWm associated with secondary node 112-*m* extends over or encompasses a range including frequencies f12 to f15 of subcarriers SC12 to SC15, respectively. On the other hand, the bandwidth of primary node 110, may encompasses the entire range of frequencies f0-f15 of subcarriers SC0 to SC15.

Figure 4A:
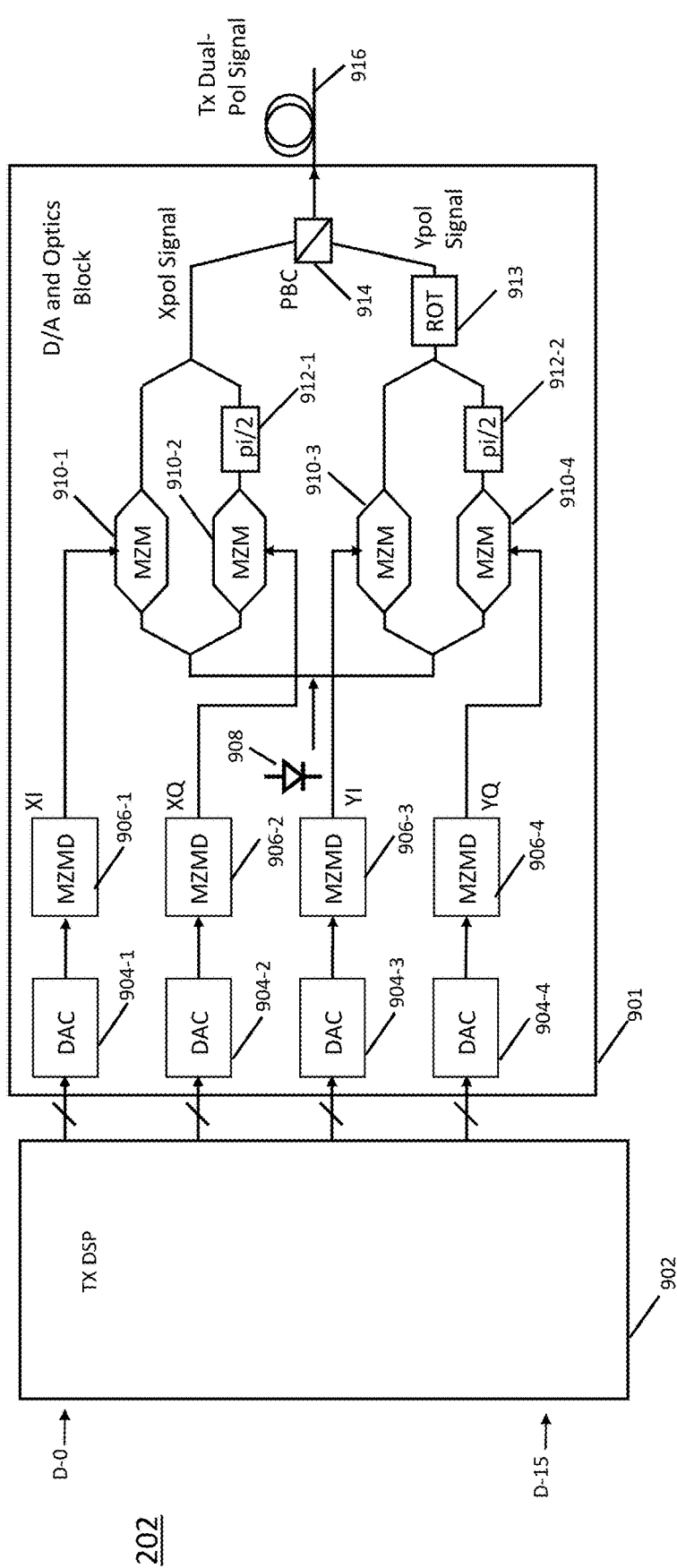
FIG. 4a shows an example of a transmitter consistent with a further aspect of the present disclosure.

Thus, as further shown in FIG. 3, optical subcarriers SC0 to SC3 are associated with and carry data intended for secondary node 112-*j*. Moreover, bandwidth BW is sufficient to encompass SC0 to SC3, such that local oscillator light fLOj having a frequency in the middle of or within bandwidth BWj (as shown in FIG. 4*a*) is sufficient for a receiver in secondary node 112-*j* to detect data carried by optical subcarriers SC0 to SC3. Similarly, optical subcarriers SC4 to SC7 are associated with and carry data intended for secondary node 112-*k*. Also, bandwidth BWk is sufficient to encompass SC4 to SC7, such that local oscillator light fLOk having a frequency in the middle of or within bandwidth BWk (as shown in FIG. 4*a*) is sufficient for a receiver in secondary node 112-*k* to detect data carried by optical subcarriers SC4 to SC7. In addition, optical subcarriers SC8 to SC11 are associated with and carry data intended for secondary node 112-*l*. Further, bandwidth BWl is sufficient to encompass SC8 to SC11, such that local oscillator light fLOl having a frequency in the middle of or within bandwidth BWl (as shown in FIG. 4*a*) is sufficient for a receiver in secondary node 112-*l* to detect data carried by optical subcarriers SC8 to SC11. Moreover, optical subcarriers SC12 to SC15 are associated with and carry data intended for secondary node 112-*m*. Also, bandwidth BWm is sufficient to encompass SC12 to SC15, such that local oscillator light fLOm having a frequency in the middle of or within bandwidth BWm (as shown in FIG. 4*a*) is sufficient for a receiver in secondary node 112-*m* to detect data carried by optical subcarriers SC12 to SC15.

When a secondary node 112 is newly added to a network, however, the secondary node local oscillator laser frequency should be set to an appropriate value, as noted above. Thus, a separate signal, referred to herein as a beacon optical signal is output from the primary node 110. The beacon signal may be amplitude (AM) modulated to carry information that is provided to the newly added secondary node 112, such that, based on such information, the secondary node may adjust its local oscillator laser for detecting data carried by particular optical subcarriers associated with that secondary node. However, the newly added secondary node 112 should detect the beacon signal at the outset and thus the local oscillator laser in the newly added secondary node should be tuned to quickly detect the beacon signal. Such tuning is described in greater detail below.

In the example shown in FIG. 3, the beacon signal is shows as SCB having a frequency f16.

FIG. 4*a* illustrates transmitter 202 of primary node 110 in greater detail. Transmitter 202 includes a transmitter DSP (TX DSP) 902 and a D/A and optics block 901. DSP 902 receives, in this example data inputs D-0 to D-15, and based on such inputs, DSP 902 supplies a plurality of digital outputs to D/A and optics block 901 including digital-to-analog conversion (DAC) circuits 904-1 to 904-4, which convert digital signal received from DSP 902 into corresponding analog signals. D/A and optics block 901 also includes driver circuits 906-1 to 906-2 that receive the analog signals from DACs 904-1 to 904-4 and adjust the voltages or other characteristics thereof to provide drive signals to a corresponding one of modulators 910-1 to 910-4.

D/A and optics block 901 further includes modulators 910-1 to 910-4, each of which may be, for example, a Mach-Zehnder modulator (MZM) that modulates the phase and/or amplitude of the light output from laser 908. As further shown in FIG. 4*a*, light output from laser 908, also included in block 901, is split such that a first portion of the light is supplied to a first MZM pairing, including MZMs 910-1 and 910-2, and a second portion of the light is supplied to a second MZM pairing, including MZMs 910-3 and 910-4. The first portion of the light is split further into third and fourth portions, such that the third portion is modulated by MZM 910-1 to provide an in-phase (I) component of an X (or TE) polarization component of a modulated optical signal, and the fourth portion is modulated by MZM 910-2 and fed to phase shifter 912-1 to shift the phase of such light by 90 degrees in order to provide a quadrature (Q) component of the X polarization component of the modulated optical signal. Similarly, the second portion of the light is further split into fifth and sixth portions, such that the fifth portion is modulated by MZM 910-3 to provide an I component of a Y (or TM) polarization component of the modulated optical signal, and the sixth portion is modulated by MZM 910-4 and fed to phase shifter 912-2 to shift the phase of such light by 90 degrees to provide a Q component of the Y polarization component of the modulated optical signal.

The optical outputs of MZMs 910-1 and 910-2 are combined to provide an X polarized optical signal including I and Q components and are fed to a polarization beam combiner (PBC) 914 provided in block 901. In addition, the outputs of MZMs 910-3 and 910-4 are combined to provide an optical signal that is fed to polarization rotator 913, further provided in block 901, that rotates the polarization of such optical signal to provide a modulated optical signal having a Y (or TM) polarization. The Y polarized modulated optical signal also is provided to PBC 914, which combines the X and Y polarized modulated optical signals to provide a polarization multiplexed ("dual-pol") modulated optical signal onto optical fiber 916, for example, which may be included as a segment of optical fiber in optical communication path 111.

The polarization multiplexed optical signal output from D/A and optics block 401 includes subcarriers SC0-SC15 and beacon signal SCB noted above, such that each subcarrier has X and Y polarization components and I and Q components. Moreover, each subcarrier SC0 to SC15 may be associated with or corresponds to a respective one of input D-0 to D-15.

While FIG. 4a shows the primary node transmitter as including a particular number and arrangement of components, in some implementations, the primary node transmitter may include additional components, fewer components, different components, or differently arranged components.

As noted above, optical subcarriers SC0 to SC15 may be provided to secondary nodes 112 in FIG. 1. An example of receiver circuit 302 in one of secondary nodes 112 will be described next with reference to FIG. 5. It is understood that each of the second node receivers may have a structure similar to that described in connection with FIG. 5 and may operate in a similar manner as the receiver shown in FIG. 5.

Figure 5:
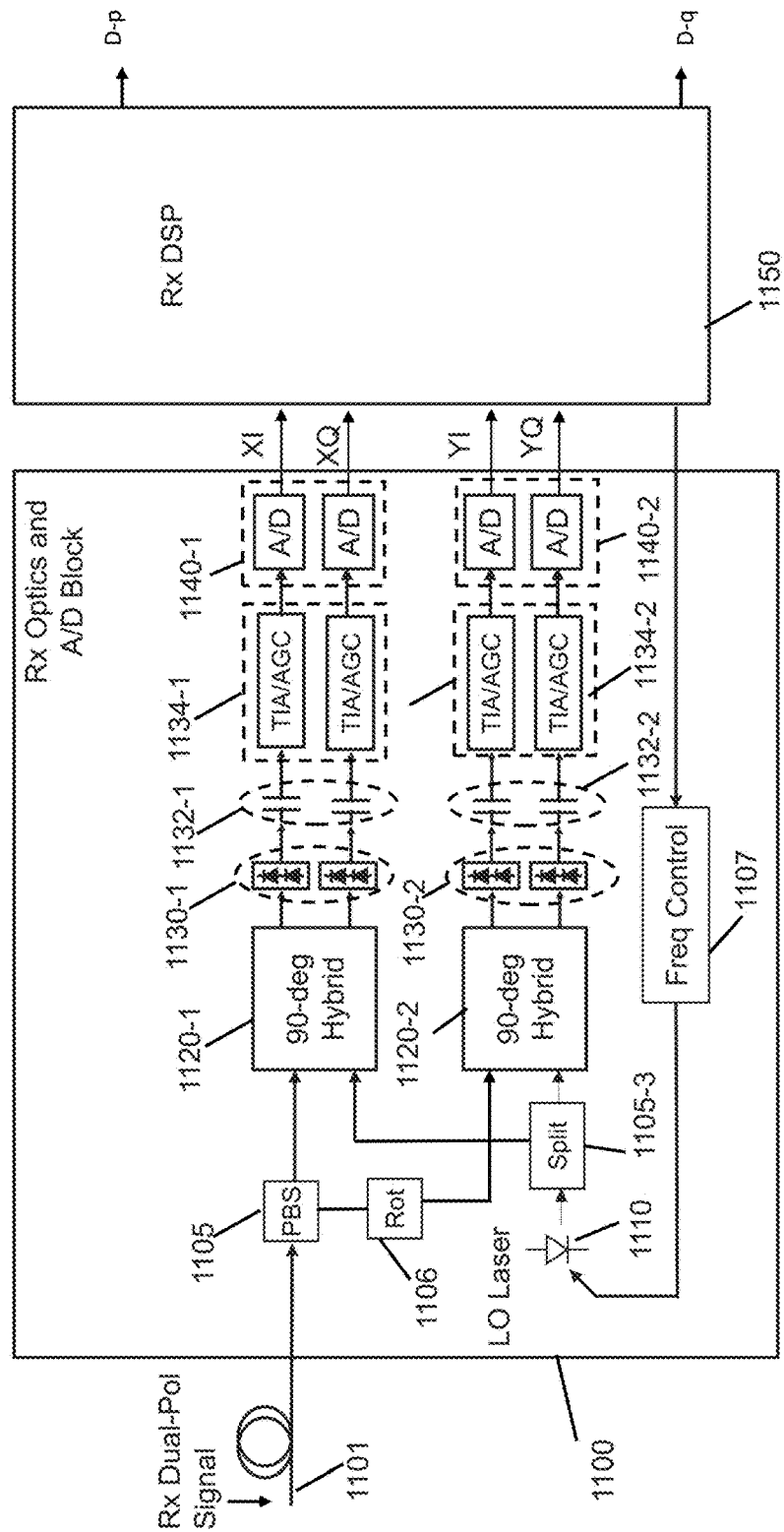
FIG. 5 illustrates an example of a receiver consistent with the present disclosure.

As shown in FIG. 5, optical receiver 302 may include an Rx optics and ND block 1100, which, in conjunction with DSP 1150, may carry out coherent detection. Block 1100 may include a polarization splitter (PBS) 1105 with first (1105-1) and second (1105-2) outputs), a local oscillator (LO) laser 1110, 90 degree optical hybrids or mixers 1120-1 and 1120-2 (referred to generally as hybrid mixers 1120 and individually as hybrid mixer 1120), detectors 1130-1 and 1130-2 (referred to generally as detectors 1130 and individually as detector 1130, each including either a single photodiode or balanced photodiode), AC coupling capacitors 1132-1 and 1132-2, transimpedance amplifiers/automatic gain control circuits TIA/AGC 1134-1 and 1134-2, ADCs 1140-1 and 1140-2 (referred to generally as ADCs 1140 and individually as ADC 1140). In one example, the local oscillator laser 1110 include a distributed feedback laser (DFB).

Polarization beam splitter (PBS) 1105 may include a polarization splitter that receives an input polarization multiplexed optical signal including optical subcarriers SC0 to SC19 supplied by optical fiber link 1101, which may be, for example, an optical fiber segment as part of one of optical communication paths 113-k to 113-m noted above. PBS 1105 may split the incoming optical signal into the two X and Y orthogonal polarization components. The Y component may be supplied to a polarization rotator 1106 that rotates the polarization of the Y component to have the X polarization. Hybrid mixers 1120 may combine the X and rotated Y polarization components with light from local oscillator laser 1110, which, in one example, is a tunable laser. For example, hybrid mixer 1120-1 may combine a first polarization signal (e.g., the component of the incoming optical signal having a first or X (TE) polarization output from a first PBS port with light from local oscillator 1110, and hybrid mixer 1120-2 may combine the rotated polarization signal (e.g., the component of the incoming optical signal having a second or Y (TM) polarization output from a second PBS port) with the light from local oscillator 1110. In one example, polarization rotator 1190 may be provided at the PBS output to rotate Y component polarization to have the X polarization.

Detectors 1130 may detect mixing products output from the optical hybrids, to form corresponding voltage signals, which are subject to AC coupling by capacitors 1132-1 and 1132-1, as well as amplification and gain control by TIA/AGCs 1134-1 and 1134-2. The outputs of TIA/AGCs 1134-1 and 1134-2 and ADCs 1140 may convert the voltage signals to digital samples. For example, two detectors (e.g., photodiodes) 1130-1 may detect the X polarization signals to form the corresponding voltage signals, and a corresponding two ADCs 1140-1 may convert the voltage signals to digital samples for the first polarization signals after amplification, gain control and AC coupling. Similarly, two detectors 1130-2 may detect the rotated Y polarization signals to form the corresponding voltage signals, and a corresponding two ADCs 1140-2 may convert the voltage signals to digital samples for the second polarization signals after amplification, gain control and AC coupling. RX DSP 1150 may process the digital samples associated with the X and Y polarization components to output data associated with one or more subcarriers within a group of subcarriers SC0 to SC15 encompassed by the bandwidth (one of bandwidths BW, BWk, BWI, and BWm) associated with the secondary node housing the particular DSP 1150. The beacon signal SCB, as noted above, carries information for tuning local oscillator laser 1110 to detect data intended for a particular secondary node 112 and carried by a group of optical subcarriers associated with that secondary node. As further noted above, local oscillator laser 1110 may be rapidly tuned upon installation in order for the secondary node receive to quickly detect beacon signal SCB.

While FIG. 5 shows optical receiver 302 as including a particular number and arrangement of components, in some implementations, optical receiver 302 may include additional components, fewer components, different components, or differently arranged components. The number of detectors 1130 and/or ADCs 1140 may be selected to implement an optical receiver 302 that is capable of receiving a polarization multiplexed signal. In some instances, one of the components illustrated in FIG. 5 may carry out a function described herein as being carry out by another one of the components illustrated in FIG. 5.

Figure 6:
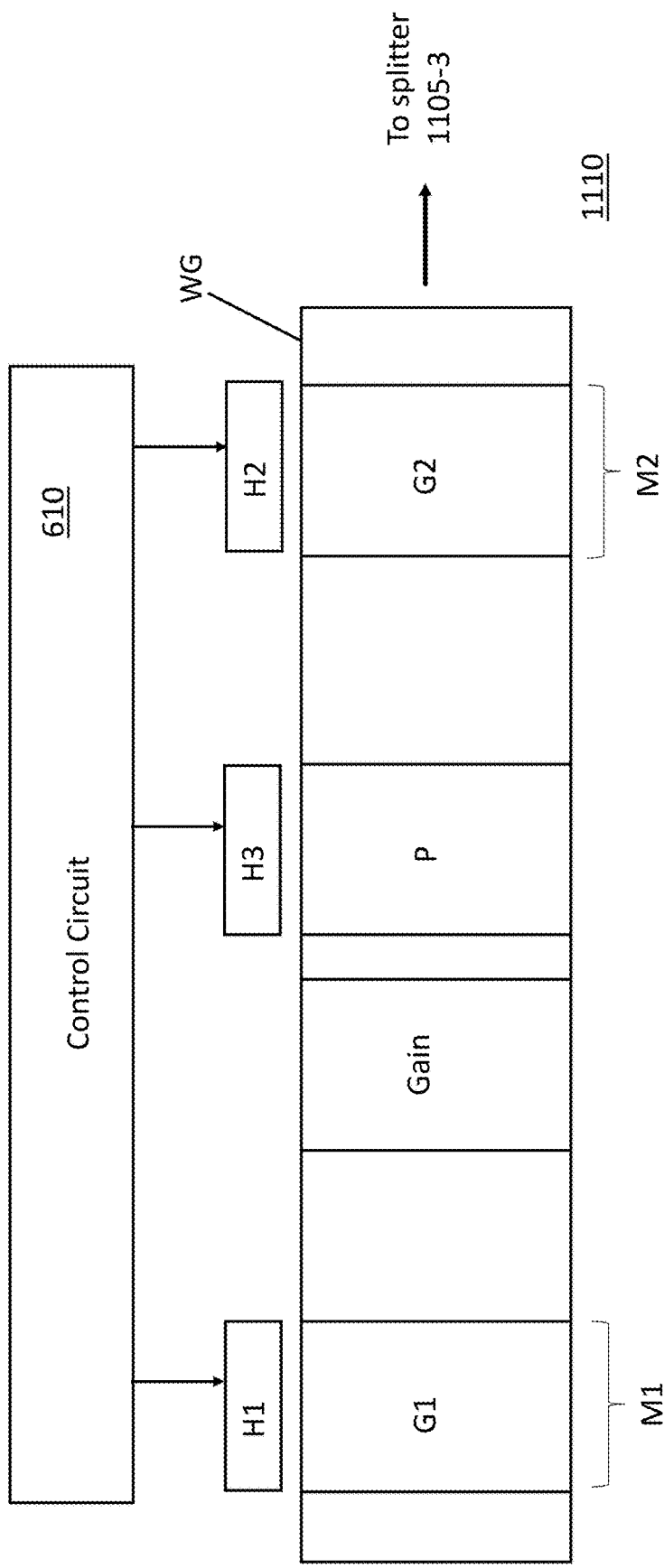
FIG. 6 shows an example of a laser and control circuit consistent with an aspect of the present disclosure.

FIG. 6 shows local oscillator laser 1110 in greater detail. Local oscillator laser 1110 may include a waveguide WG, which further includes mirrors or mirror sections M1 and M2, each of which including gratings G1 and G2, respectively. Heaters H1 and H2 are provided adjacent gratings G1 and G2, respectively, and heater H3 is provided adjacent phase section P. Heaters H1, H2, and H3, in one example, may each include a respective thin film heater including platinum or other suitable material. Control circuit 610 is operable to provide electrical power, by way of, for example, a voltage or current supplied to each of heaters H1 to H3, such that the temperature of the heaters may be adjusted based on the electrical power supplied thereto. Accordingly, control circuit 610 is thus further operable to control the temperature of the gratings G1 and G2, as well as phase section P. By changing the temperature of gratings G1 and G2, the spacing between such gratings may change, such that the wavelength or frequency of light output from laser 1110 also changes. Moreover, the refractive index of phase section P may also change as a function of temperature such that wavelength or frequency of light output from laser 1110 may be further controlled or adjusted by power supplied to heater H3.

As further shown in FIG. 6, light output from laser 1110 may be provided to splitter 1105-3 shown in FIG. 5.

As noted above and consistent with the present disclosure, power is selectively applied to heaters H1, H2, and H3 in an optimal manner to facilitate rapid tuning of the local oscillator light. Such rapid tuning will next be described with reference to FIGS. 7-9.

Figure 7:
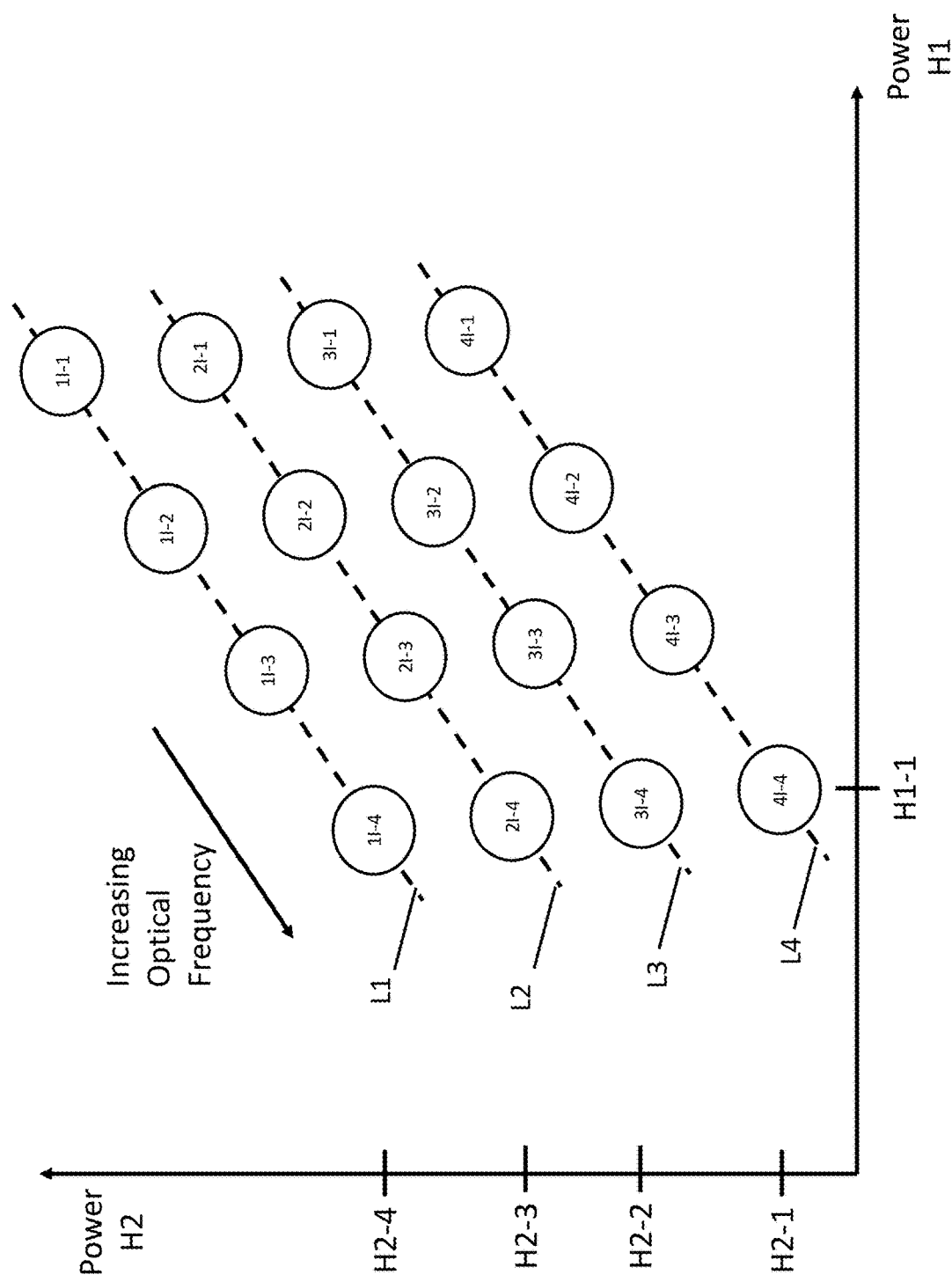
FIG. 7 shows a plot of example tuning ranges consistent with a further aspect of the present disclosure.

FIG. 7 illustrates a plot 700 of heater power H1 and corresponding heater powers H2. As shown in FIG. 7, for a given heater power H1-1 applied to heater H1, for example, heater powers H2-1 to H2-4 may be applied to heater H2. An "island" may be assigned for each combination of H1 and H2 heater powers. Thus, for example, heater power combination H1-1 and H2-1 is associated with island 4I-4, heater power combination H1-1 and H2-2 is associated with island 4I-3, heater power combination H1-1 and H2-3 is associated with island 2I-4, and heater power combination H1-1 and H2-4 is associated with island 1I-4. Each of remaining islands 1I-1 to 1I-3, 2I-1 to 2I-3, 3I-1 to 3I-3, and 4I-1 to 4I-3 is similar associated with a heater a unique heater power combination.

As further shown in FIG. 7, incremental linear increases in powers applied to heaters H1 and H2 from one island to the next result in combinations of islands that constitute a "lane." Thus, for example, islands 1I-1 to 1I-4 constitute lane L1, islands 2I-1 to 2I-4 constitute lane L2, islands 3I-1 to 3I-4 constitute lane L3, and islands 4I-1 to 4I-4 constitute lane L4.

Tuning between lanes, tuning between islands within a given lane, and tuning within an island by applying power to phase section P may required different amounts of time or may be associated with different local oscillator frequency slew rates. For example, any change from the end of one lane to the beginning of another by way of applying power to heaters H1 and H2 may require 400 ms to 500 ms for the resulting local oscillator frequency to be stable within ±5 GHz. Thus, changing from a first lane to a third lane would require 500 ms, which is large amount of time.

Changing from one island to another within a lane or to an adjacent island the next lane over by way of applying power to heaters H1 and H2 may require 40 ms per island transition for frequency stabilization. Thus, transitioning from island 2I-1 to 2I-3 by applying power to heaters H1 and H2 may require 3×40 ms or 120 ms for the local oscillator frequency to stabilize. However, tuning within an island by way of not changing the power to heaters H1 and H2 but applying power to phase section P may require 2 ms for the local oscillator laser to stabilize. Shorter stabilization times are desirable in order for the local oscillator laser to be used to detect the beacon signal and recover the data associated therewith. Thus, tuning by way of applying power to heater H3 associated with phase section P, has the advantage of having such reduced stabilization times. However, tuning with the phase section heater is typically limited to narrow tuning ranges.

FIG. 4b illustrates a further example of a beacon signal consistent with the present disclosure. Here, subcarriers SC0 to SC15 are collectively amplitude modulated (AM) with a low frequency signal carrying information for controlling the receiver and/or transmitter in the leaf node and thus corresponds to the beacon in this example. The AM modulation is represented double-head arrows 487-2. The AM modulation may be, for example, at a frequency of 1-3 MHz, while the user data carried by each optical subcarrier SC0 to SC15 may be at a rate of 50 GHz or higher rate, such as 80 GHz or 100 GHz. In one example, such information includes information for controlling the local oscillator in the leaf node to tune to a frequency for detecting data associated with one or more optical subcarriers carrying data designated for that leaf node. As noted above, the leaf node has a local oscillator laser that supplies light having a frequency of fLO (here fLOj associated with leaf node 112-j). Receiver circuitry in node 112-j is operable to detect, by way of coherent detection, optical signals and/or subcarriers having frequencies within bandwidth BWj. As fLOj is tuned, as indicated by arrow 487, bandwidth or capture frequency range BWj also shifts in frequency.

After tuning fLOj so that one of optical subcarriers SC0 to SC15, e.g., subcarrier SC0, falls within capture frequency range BW, the AM modulation may be detected by way of coherent detection in the leaf node receiver, and the information carried by the AM modulation may be used to further tune fLOj for detecting data carried by subcarrier associated with, in this example, secondary node or leaf node 112-j.

Accordingly, consistent with the present disclosure, when tuning local oscillator laser transitions between islands and within islands, (whereby the power levels applied to heaters H1 and H2 in addition to adjusting the phase section P) are maximized, while transitions between lanes are minimized.

Figure 8:
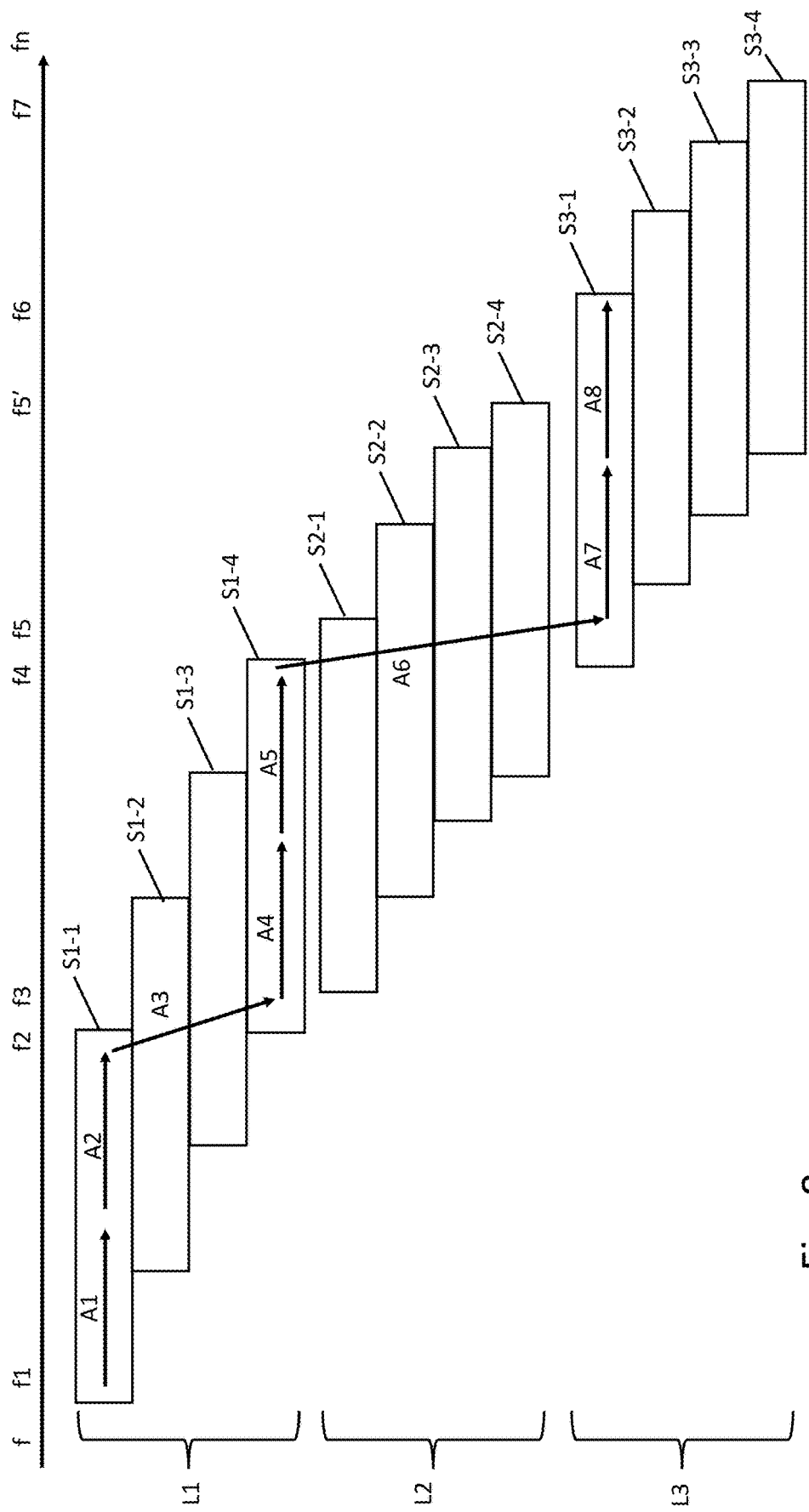
FIG. 8 shows a plot of heater powers consistent with the present disclosure.

FIG. 8 shows an alternate representations of the lanes and islands shown in FIG. 7. Here, lane I1 is associated with a range of frequencies defined by a lowest frequency, f1, and a highest or maximum frequency, f4, and includes frequency sub-ranges S1-1 to S1-4 associated with islands 1I-1 to 1I-4, respectively. As further shown in FIG. 8, lane L2 is associated with a range of frequencies extending from frequency f2 to f5' and includes frequency sub-ranges S2-1 to S2-4 corresponding to islands 2I-1 to 2I-4, respectively. In addition, lane L3 is associated with a range of frequencies extending from frequency f5 to f7 and includes frequency sub-ranges S3-1 to S3-4 corresponding to islands 3I-1 to 3I-4, respectively.

Figure 9:
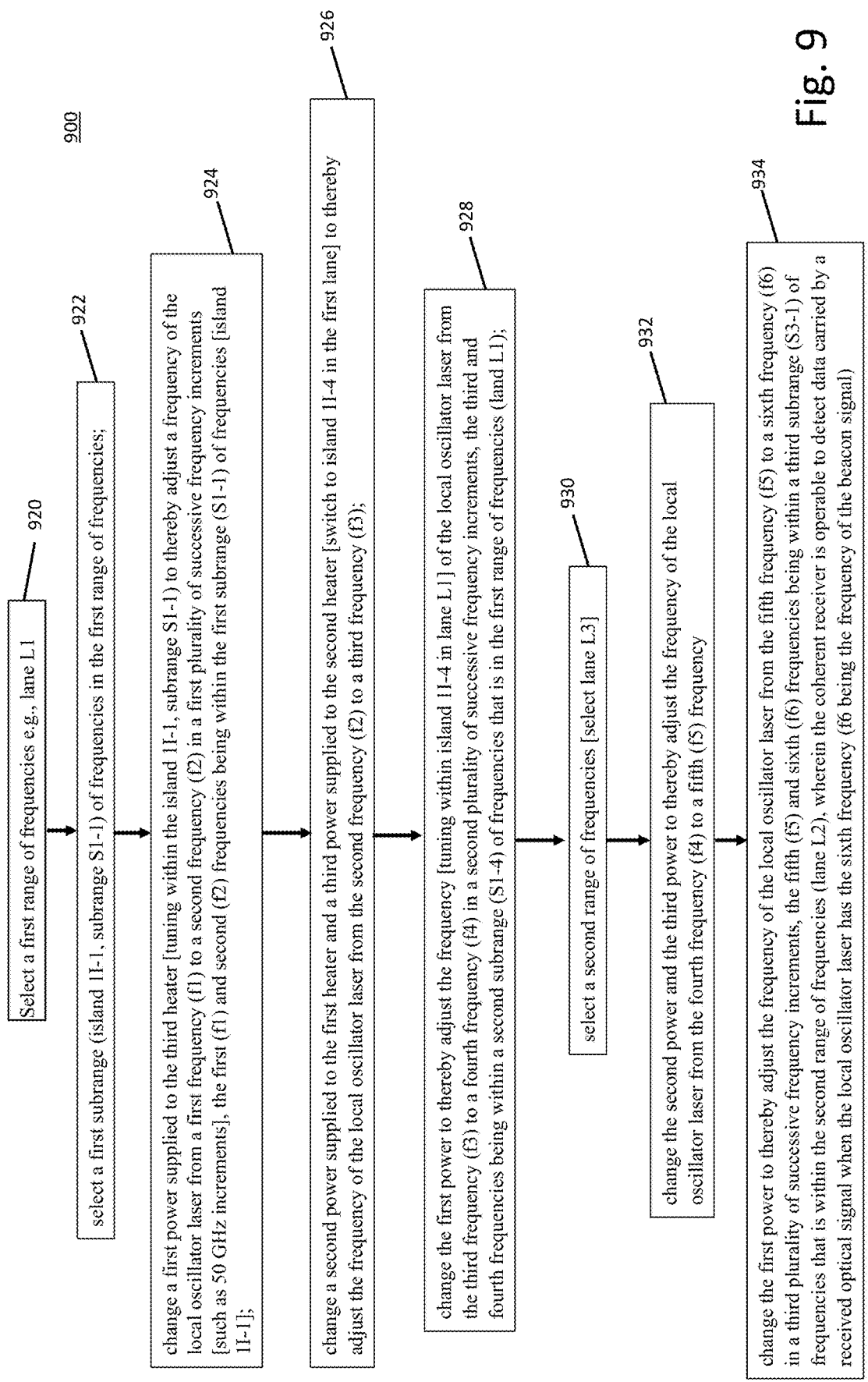
FIG. 9 is a flow chart showing steps of a method consistent with an aspect of the present disclosure.

A frequency tuning method consistent with the present disclosure will next be described with further reference to FIG. 8 and flow chart 900 shown in FIG. 9. It is noted that the powers supplied to heaters H1 to H3 for implementing the disclosed method may be supplied by control circuit 610 shown in FIG. 6. In step 920, a first range of frequencies is selected (e.g., lane L1) by control circuit 610, and in step 922 a first subrange (e.g., island 1I-1, subrange S1-1) of frequencies is selected by control circuit 610 in the first range of frequencies (lane L1). Next, in step 924, a first power supplied to the third heater (heater H3) to thereby adjust a frequency of the local oscillator laser from a first frequency (f1) to a second frequency (f2) in a first plurality of successive frequency increments (such as 50 GHz increments, arrows A1 and A2), the first (f1) and second (f2) frequencies being within the first subrange of frequencies (S1-1). Step 924 is typically repeated as many times as possible to detect the beacon signal until the wavelength limit of the current island is reached. As noted above, transitions or turning within an island require less time than transitions between island or between lanes. Accordingly, consistent with the present disclosure, faster tuning is achieved by maximizing tuning with islands while minimizing tuning between islands and lanes.

In step 926, a second power supplied to the first heater and a third power supplied to the second heater are changed (switch to island 1I-4 in the first lane] to thereby adjust the frequency of the local oscillator laser 1110 from the second frequency (f2) to a third frequency (f3) (arrows A3). In addition, the phase section heater H3 may be reset to a lower level when tuning to a new island. Next, in step 928, the first power is changed to thereby adjust the frequency (tuning within island 1I-4 in lane L1) of the local oscillator laser 1110 from the third frequency (f3) to a fourth frequency (f4) in a second plurality of successive frequency increments (arrows A4 and A5), the third and fourth frequencies being within a second subrange (S1-4) of frequencies that is in the first range of frequencies (lane L1). In step 930, a second range of frequencies (lane L3) is selected by control circuit 610, and, in step 932, the second power and the third power are changed to thereby adjust the frequency of the local oscillator laser from the fourth frequency (f4) to a fifth (f5) frequency (arrow A6). Further, in step 934, the first power (heater H3) is changed to thereby adjust the frequency of the local oscillator laser from the fifth frequency (f5) to a sixth frequency (f6) in a third plurality of successive frequency increments (of 50 GHz, for example, see arrows A7 and A8), the fifth (f5) and sixth (f6) frequencies being within a third subrange (S3-1) of frequencies that is within the second range of frequencies (lane L2), wherein the coherent receiver is operable to detect data carried by a received optical signal when the local oscillator laser 1110 has the sixth frequency (f6 being the frequency of the beacon signal). It is noted that, in each transition to a new frequency, e.g., from f1 to f2, a determination is made as to whether the beacon signal SCB has been detected. If it has, no further tuning to search for the beacon signal is performed. In the above example, the beacon signal frequency is f6, such that local oscillator frequency is set to the frequency of the beacon signal. It is also noted that a similar determination as to whether the beacon signal is detected is made after each frequency increment, e.g., after changing the frequency by an increment of 50 GHz from frequency f1 to frequency f1' (see arrow A1). Arrow A2 represents a similar frequency increment, which may also be 50 GHz.

It is noted that, in the above example, the transition from frequency f4 to frequency f5 skips lane L2 (having a lowest frequency f3 and a highest frequency f5') and sub-ranges S2-1 to S2-4, thereby reducing the tuning time by not tuning in those subranges. Moreover, most transitions occur within islands or subranges, e.g., S1-1, S1-4, and S3-1, thereby minimizing transitions between lanes, e.g., only one such transition, i.e., between lane L1 and L3 occurs in the above example.

Consistent with a first aspect of the present disclosure, rather than sweep each lane in the same direction, alternating lane direction may be carried out whereby when a frequency sweep reaches the end of a lane, a transition is made to the closes island on the next lane, and the next lane is frequency swept in the opposite direction. Such alternate sweeping minimizes sweep time by avoiding large thermal transients when switching to a new lane.

Figure 10A:
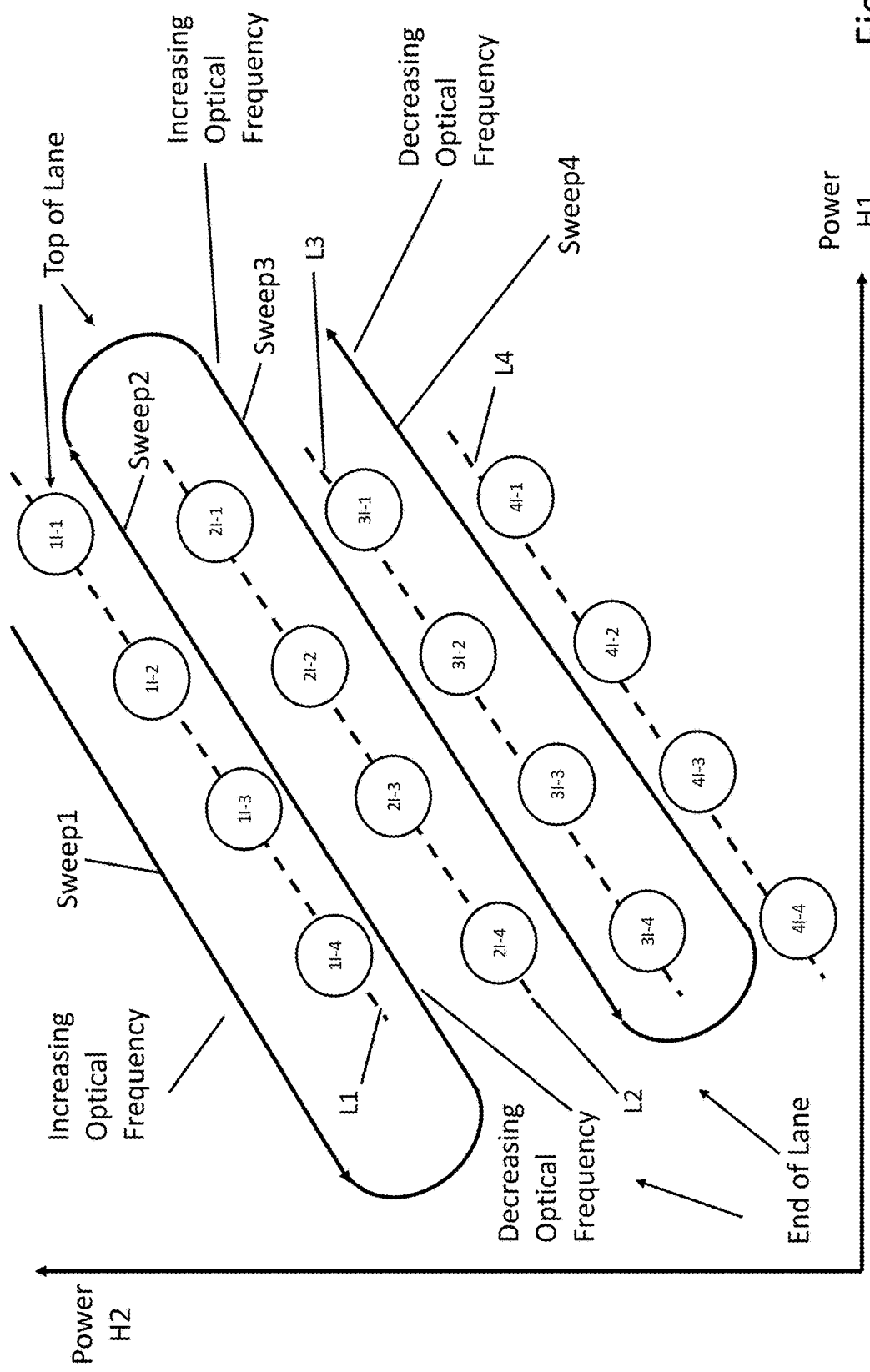
FIG. 10a shows a plot of example tuning ranges and slew directions consistent with a further aspect of the present disclosure.

FIG. 10a illustrates an example of such alternate sweeping. Here, a first tuning range (e.g., lane L1) is selected by control circuit 610. L1, in this example, is defined by a lowest frequency associated with island 1I-1 and a highest frequency associated with island 1I-4. Next, the frequency of the light output from output from local oscillator laser 1110 is increased (Sweep1) from a first frequency within the first tuning range (lane L1) to a second frequency within the first tuning range by changing, under control by control circuit 610, a first power supplied to the first heater (H1) and changing a second power supplied to the second heater (H2). Next, a second tuning range, such as lane L2 is selected by control circuit 610. The second tuning range, lane L2, has a lowest second frequency associated with island 2L-1 and a highest second frequency associated with island 2I-4. Next, based on outputs of control circuit 610, the frequency of the light output from the local oscillator laser 1110 is decreased (Sweep2) from a third frequency within the second tuning range to a fourth frequency within the second tuning range by changing the first power and the second power supplied to heaters H1 and H2, respectively. Next, the frequency of the light output from the local oscillator laser 1110 is adjusted from the fourth frequency to a fifth frequency by changing a third power supplied to the third heater (by using the phase section heater H3 to rapidly fine tune the LO frequency). If the beacon signal is not detected during Sweep1 or Sweep2, further frequency sweeps Sweep3 and Sweep4 may be carried out until to detect the beacon.

Figure 10B:
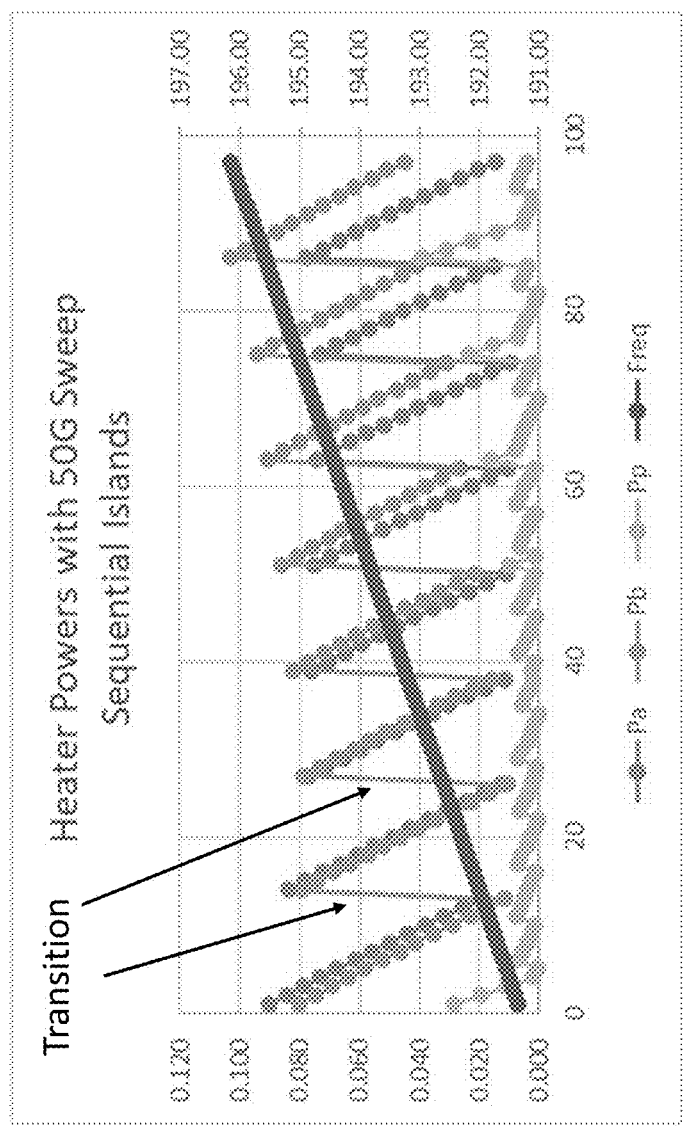
FIGS. 10b and 10c show plots of heater powers and corresponding local oscillator frequencies consistent with an aspect of the present disclosure.

FIG. 10b is a plot of heater H1 (Pa), heater H2 (Pb), and heater H3 (Pp) powers and associated leaf local oscillator frequencies (Freq). Here, the Transitions shown in the plot correspond to a transition from the top of a lane to the bottom of an adjacent lane or vis a versa (see FIG. 10a). Such transitions may result in significant changes in power between adjacent LO frequencies during the scan or tuning over the C band. Such power changes are minimized or reduced if the tuning is carried per the example shown in FIG. 10a.

Figure 10C:
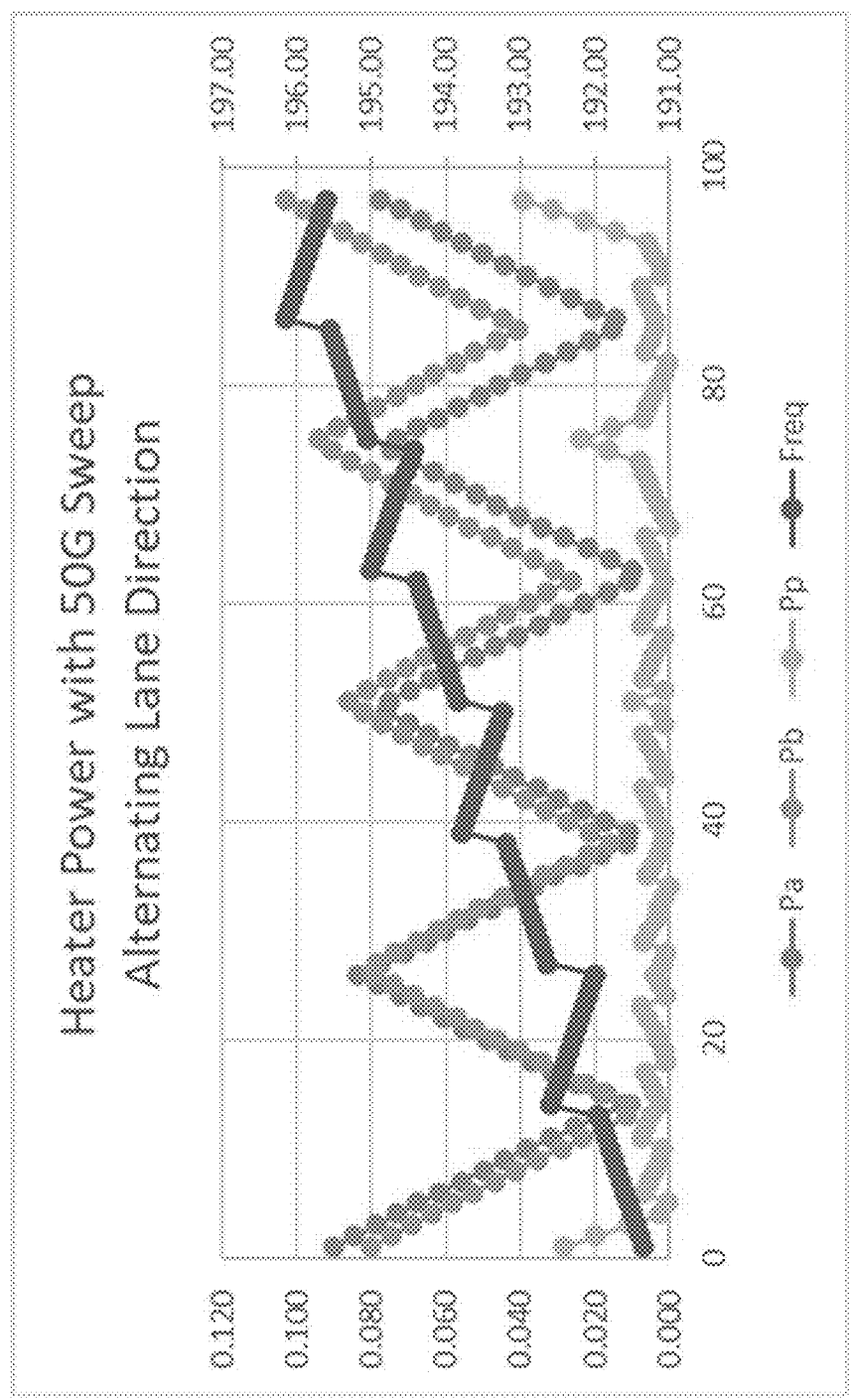

FIG. 10c is similar to the plot shown in FIG. 10b, but tuning is carried out by alternating between lanes such that the local oscillator laser is tuned in one direction to the bottom of a first lane and then tuned in the opposite direction to the top of an adjacent lane as discussed above in connection with FIG. 10a. Such tuning or sweeping avoids large thermal changes of the local oscillator laser so delays are minimized.

Other embodiments will be apparent to those skilled in the art from consideration of the specification. It is intended that the specification and examples be considered as exemplary only, with a true scope and spirit of the invention being indicated by the following claims.

What is claimed is:

1. A method of tuning a local oscillator laser in a coherent receiver, wherein the laser includes a first grating, a second grating, a phase section, a first heater adjacent the first grating, a second heater adjacent the second grating, and a third heater adjacent the phase section, the method comprising the steps of:

selecting a first range of frequencies;

selecting a first subrange of frequencies in the first range of frequencies;

changing a first power supplied to the third heater to thereby adjust a frequency of the local oscillator laser from a first frequency to a second frequency in a first plurality of successive frequency increments, the first and second frequencies being within the first subrange of frequencies;

changing a second power supplied to the first heater and a third power supplied to the second heater to thereby adjust the frequency of the local oscillator laser from the second frequency to a third frequency;

changing the first power to thereby adjust the frequency of the local oscillator laser from the third frequency to a fourth frequency in a second plurality of successive frequency increments, the third and fourth frequencies being within a second subrange of frequencies that is in the first range of frequencies;

selecting a second range of frequencies;

changing the second power and the third power to thereby adjust the frequency of the local oscillator laser from the fourth frequency to a fifth frequency;

changing the first power to thereby adjust the frequency of the local oscillator laser from the fifth frequency to a sixth frequency in a third plurality of successive frequency increments, the fifth and sixth frequencies being within a third subrange of frequencies that is within the second range of frequencies, wherein the coherent receiver is operable to detect data carried by a received optical signal when the local oscillator laser has the sixth frequency.

2. A method in accordance with claim 1, wherein the first and second ranges of frequencies are among a plurality of ranges of frequencies, which also includes a third range of frequencies, the third range of frequencies being defined by a lowest frequency that is greater than a lowest frequency of the first range of frequencies and a highest frequency that is less than a highest frequency of the second range of frequencies.

3. A method in accordance with claim 1, wherein the laser is a distributed feedback (DFB) laser.

4. A method in accordance with claim 1, wherein the laser includes a waveguide, the first and second gratings, the gain section and the phase section being provided in the waveguide.

5. A method in accordance with claim 1, wherein the fifth frequency is the same as a frequency of the received optical signal.

6. A method in accordance with claim 1, wherein each of the first power, the second power, and the third power is an electrical power.

7. A method in accordance with claim 1, wherein said adjusting the frequency of the local oscillator laser from a first frequency to the second frequency includes increasing the frequency of light output from the local oscillator laser.

8. A method in accordance with claim 7, wherein said adjusting the frequency of the local oscillator laser from the second frequency to the third frequency includes increasing the frequency of light output from the laser.

9. A coherent receiver, comprising:
a local oscillator laser, wherein the laser includes a first grating, a second grating, a phase section, a first heater adjacent the first grating, a second heater adjacent the second grating, and a third heater adjacent the phase section; and
a control circuit operable to:
select a first range of frequencies;
select a first subrange of frequencies in the first range of frequencies;
change a first power supplied to the third heater to thereby adjust a frequency of the local oscillator laser from a first frequency to a second frequency in a first plurality of successive frequency increments, the first and second frequencies being within the first subrange of frequencies;
change a second power supplied to the first heater and a third power supplied to the second heater to thereby adjust the frequency of the local oscillator laser from the second frequency to a third frequency;

change the first power to thereby adjust the frequency of the local oscillator laser from the third frequency to a fourth frequency in a second plurality of successive frequency increments, the third and fourth frequencies being within a second subrange of frequencies that is in the first range of frequencies;

select a second range of frequencies;

change the second power and the third power to thereby adjust the frequency of the local oscillator laser from the fourth frequency to a fifth frequency;

change the first power to thereby adjust the frequency of the local oscillator laser from the fifth frequency to a sixth frequency in a third plurality of successive frequency increments, the fifth and sixth frequencies being within a third subrange of frequencies that is within the second range of frequencies, wherein the coherent receiver is operable to detect data carried by a received optical signal when the local oscillator laser has the sixth frequency.

10. A coherent receiver in accordance with claim 1, wherein the first and second ranges of frequencies are among a plurality of ranges of frequencies, which also includes a third range of frequencies, the third range of frequencies being defined by a lowest frequency that is greater than a lowest frequency of the first range of frequencies and a highest frequency that is less than a highest frequency of the second range of frequencies.

11. A coherent receiver in accordance with claim 9, wherein the laser is a distributed feedback (DFB) laser.

12. A coherent receiver in accordance with claim 9, wherein the laser includes a waveguide, the first and second gratings, the gain section and the phase section being provided in the waveguide.

13. A coherent receiver in accordance with claim 9, wherein the fifth frequency is the same as the frequency of the received optical signal.

14. A coherent receiver in accordance with claim 9, wherein the power is an electrical power.

15. A coherent receiver in accordance with claim 9, wherein said adjusting the frequency of the local oscillator laser from a first frequency to the second frequency includes increasing the frequency of light output from the local oscillator laser.

16. A coherent receiver in accordance with claim 15, wherein said adjusting the frequency of the local oscillator laser from the second frequency to the third frequency includes increasing the frequency of light output from the laser.

17. A method of tuning a local oscillator laser in a coherent receiver, wherein the laser includes a first grating, a second grating, a phase section, a first heater adjacent the first grating, a second heater adjacent the second grating, and a third heater adjacent the phase section, the method comprising the steps of:
selecting a first tuning range among a plurality of tuning ranges, the first tuning range being defined by a lowest frequency and a highest frequency;
increasing a frequency of light output from the local oscillator laser from a first frequency within the first tuning range to a second frequency within the first tuning range by changing a first power supplied to the first heater and changing a second power supplied to the second heater;

selecting a second tuning range among the plurality of tuning ranges, the second tuning range having a lowest second frequency and a highest second frequency;

decreasing the frequency of the light output from the local oscillator laser from a third frequency within the second tuning range to a fourth frequency within the second tuning range by changing the first power and the second power;

adjusting the frequency of the light output from the local oscillator laser from the fourth frequency to a fifth frequency by changing a third power supplied to the third heater.

18. A method in accordance with claim 17, wherein the laser is a distributed feedback (DFB) laser.

19. A method in accordance with claim 17, wherein the laser includes a waveguide, the first and second gratings, the gain section and the phase section being provided in the waveguide.

20. A method in accordance with claim 17, wherein the fifth frequency is the same as the frequency of the received signal.

21. A method in accordance with claim 17, wherein each of the first power, the second power, and the third power is an electrical power.

22. A method in accordance with claim 17, further including:

detecting data associated with the optical signal when the frequency of the light output from the local oscillator laser has the fifth frequency.

23. A coherent receiver, comprising:

a local oscillator laser, wherein the local oscillator laser includes a first grating, a second grating, a phase section, a first heater adjacent the first grating, a second heater adjacent the second grating, and a third heater adjacent the phase section; and a control circuit operable to:

select a first tuning range among a plurality of tuning ranges, the first tuning range being defined by a lowest frequency and a highest frequency;

increase a frequency of light output from the local oscillator laser from a first frequency within the first tuning range to a second frequency within the first tuning range by changing a first power supplied to the first heater and changing a second power supplied to the second heater;

select a second tuning range among the plurality of tuning ranges, the second tuning range having a lowest second frequency and a highest second frequency;

decrease the frequency of the light output from the local oscillator laser from a third frequency within the second tuning range to a fourth frequency within the second tuning range by changing the first power and the second power;

adjust the frequency of the light output from the local oscillator laser from the fourth frequency to a fifth frequency by changing a third power supplied to the third heater.

24. A coherent receiver in accordance with claim 23, wherein the local oscillator laser is a distributed feedback (DFB) laser.

25. A coherent receiver in accordance with claim 23, wherein the local oscillator laser includes a waveguide, the first and second gratings, the gain section and the phase section being provided in the waveguide.

26. A coherent receiver in accordance with claim 23, wherein the fifth frequency is the same as the frequency of the received signal.

27. A coherent receiver in accordance with claim 23, wherein each of the first power, the second power, and the third power is electrical power.

28. A coherent receiving in accordance with claim 23, further including an optical hybrid, wherein the local oscillator laser supplies the light to the optical hybrid.

* * * * *